United States Patent
Sanada

(10) Patent No.: US 8,436,421 B2
(45) Date of Patent: May 7, 2013

(54) SEMICONDUCTOR DEVICE WITH TRENCH GATE TRANSISTORS AND METHOD FOR PRODUCTION THEREOF

(75) Inventor: Kazuhiko Sanada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 48 days.

(21) Appl. No.: 13/011,544

(22) Filed: Jan. 21, 2011

(65) Prior Publication Data

US 2011/0180869 A1 Jul. 28, 2011

(30) Foreign Application Priority Data

Jan. 25, 2010 (JP) .................................. 2010-013401

(51) Int. Cl.
*H01L 29/66* (2006.01)

(52) U.S. Cl.
USPC ............. 257/334; 257/506; 438/10; 438/270; 438/424

(58) Field of Classification Search .................. None
See application file for complete search history.

(56) References Cited

U.S. PATENT DOCUMENTS

| 6,399,985 B2 * | 6/2002 | Horita et al. .................. 257/330 |
| 6,452,231 B1 | 9/2002 | Nakagawa et al. |
| 7,492,035 B2 | 2/2009 | Risaki |
| 2005/0042833 A1 * | 2/2005 | Park et al. ..................... 438/282 |
| 2006/0223253 A1 | 10/2006 | Risaki |
| 2008/0087948 A1 * | 4/2008 | Kim ............................. 257/330 |

FOREIGN PATENT DOCUMENTS

| JP | 11-103058 | 4/1999 |
| JP | 11-150265 | 6/1999 |
| JP | 2006-294645 | 10/2006 |

* cited by examiner

*Primary Examiner* — Evan Pert
*Assistant Examiner* — Andres Munoz
(74) *Attorney, Agent, or Firm* — Young & Thompson

(57) ABSTRACT

A semiconductor device contains a first transistor including a single trench which is formed on a substrate between a source region and a drain region and a gate electrode which is formed in the single trench, a second transistor including at least two trenches which are formed on the substrate between a source region and a drain region and a gate electrode which is formed in the at least two trenches, and also contains a device isolation insulating which isolates the region in which the transistor is formed. The first transistor has first distance between the single trench and the device isolation insulating film and the second transistor has second distance between the adjoining trenches, such the first distance is less than the second distance in a gate width direction.

8 Claims, 11 Drawing Sheets

SEMICONDUCTOR DEVICE WITH TRENCH GATE TRANSISTORS AND METHOD FOR PRODUCTION THEREOF

CROSS-REFERENCE TO RELATED APPLICATIONS

The disclosure of Japanese Application publication No. 2010-13401 filed on Jan. 25, 2010, including the specification, drawings and abstract is incorporated herein by reference in its entirety.

BACKGROUND

1. Field of the Invention

The present invention relates to a semiconductor device and a method for production thereof and, more particularly, to a semiconductor device containing transistors of trench gate structure and a method for production thereof.

2. Description of Related Art

There is known a technology of forming surface irregularities such as trenches in the channel region on a substrate in order to substantially expand the channel width of a transistor.

For example, there has been disclosed a semiconductor containing transistors of trench gate structure which has trenches formed on its substrate surface. See Japanese Application Publication No. Hei11(1999)-103058.

There has also been disclosed a semiconductor device or a field effect transistor which has, in the substrate of the semiconductor held between the source region and the drain region formed in the substrate of the semiconductor, a gate electrode formed in the vertical direction with respect to the surface direction of the substrate of the semiconductor, so that the channel region for current flowing between the source region and the drain region is formed along the gate electrode and in the vertical direction with respect to the surface of the substrate of the semiconductor. See Japanese Application Publication No. Hei11(1999)-150265.

In addition, there has been disclosed a semiconductor device which has a well region of high-resistance first conductivity type formed to a certain depth from the surface of semiconductor, a plurality of trenches reaching the midway from the surface of the well region, a gate insulating film formed on the surface of irregularities for the trenches to be formed, a gate electrode buried inside the trenches, a gate insulating film formed on the substrate surface in contact with the gate electrode buried inside the trenches in the irregularities region excluding the neighborhood of both ends of the trench, and a source region and a drain region which are two semiconductor layers of low-resistance second conductivity type and are formed shallower than the well region in the well region excluding the lower part of the gate insulting film. See Japanese Application Publication No. 2006-294645.

SUMMARY

The conventional trench structure transistor has never been reviewed for the idea of forming on a single substrate several kinds of transistors differing in the number of trenches or for the characteristic properties of transistor of such structure.

Trench structure transistors are for example used for a LCD driver. The LCD driver includes various circuits, and transistors configuring these circuits also include transistors having various electric current capabilities. To put transistors having various electric current capabilities into practice, the number of trenches of a transistor is used as the electric current capabilities demand. A transistor having many trenches is used as a transistor requiring electric current capability to increase a gate width.

Meanwhile, the LCD driver has a circuit block called a digital-analog converter (DAC). Because the DAC requires no electric current capability, transistors used for the DAC may have a minimum gate width, and thus one trench structure transistor is used therefor.

It is necessary to use transistors having various electric current capabilities as described above. However, it has become a problem that the performance of a transistor other than electric current capability depends on a gate width.

The present inventor found that the trench structure transistor which has two or more trenches undergoes fluctuation in the threshold voltage (Vt) of back gate voltage due to major factors which are the same regardless of the number of trenches. The inventor also found that factors affecting fluctuation in the threshold voltage (Vt) of back gate voltage differ between the transistor having one trench and the transistor having two or more trenches.

The result of the present inventors' investigation revealed (as detailed later) that in the case of transistor having one trench, the amount of fluctuation in the threshold voltage (Vt) due to back gate voltage depends on the gap (c) between the trench and the device isolation insulating film in the gate width direction. By contrast, it also revealed that in the case of transistor having two or more trenches, the amount of fluctuation in the threshold voltage (Vt) due to back gate voltage depends basically on the gap (a) between the adjoining trenches in the gate width direction. Moreover, it also revealed that in the case where the gap (c) in the transistor having one trench is equal to the gap (a) in the transistor having two or more trenches, the amount of fluctuation in the threshold voltage (Vt) due to back gate electrode in the transistor having one trench is much larger than the amount of fluctuation in the threshold voltage (Vt) due to back gate electrode in the transistor having two or more trenches. The fact that the threshold voltage (Vt) due to back gate voltage greatly fluctuates means that the threshold voltage (Vt) largely differs among transistors when a back gate voltage is applied to them. These characteristic properties are undesirable for actions in the circuits of certain type.

According to an aspect of the present invention, there is provided a semiconductor device which includes:

a substrate;

a device isolation region;

a source region and drain region, both of which are of a first conductivity type;

a channel region of a second conductivity type between the source region and the drain region;

a first transistor including a trench which is formed on the substrate between the source region and the drain region and a gate electrode which is formed in the trench;

a second transistor including a plurality of trenches which are formed on the substrate between the source region and the drain region and a gate electrode which is formed in the trenches;

a first transistor including a single trench which is formed on the substrate between the source region and the drain region and a gate electrode which is formed in the single trench;

a second transistor including at least two trenches which are formed on the substrate between the source region and the drain region and a gate electrode which is formed in the at least two trenches;

wherein a distance between the single trench and the device isolation region in a gate width direction is less than a distance between adjacent ones of said at least two trenches in a gate width direction.

According to another aspect of the present invention, there is provided a method for manufacturing a semiconductor device, comprising:

forming a device isolation region on a substrate;

forming a source region and drain region, both of which are of a first conductivity type;

forming a channel region of a second conductivity type between the source region and the drain region;

forming a first transistor including a single trench which is formed on the substrate between the source region and the drain region and a gate electrode which is formed in the single trench;

forming a second transistor including at least two trenches which are formed on the substrate between the source region and the drain region and a gate electrode which is formed in the at least two trenches; and determining the values of a distance ax and a distance cx such that a distance cx between the single trench and the device isolation region in a gate width direction is less than a distance ax between adjacent ones of said at least two trenches in a gate width direction.

As mentioned above, the first transistor having only one trench differs from the second transistor having two or more trenches in the major factors that cause the threshold voltage Vt to fluctuate due to back gate voltage. In the case of the first transistor, the amount of fluctuation in the threshold voltage Vt due to back gate voltage depends on the gap c (in the gate width direction) between the trench and the element separation isolating film, whereas in the case of the second transistor, the amount of fluctuation in the threshold voltage Vt due to back gate voltage depends basically on the gap a (in the gate width direction) between the adjoining trenches. Also, if the gap c in the first transistor is equal to the gap a in the second transistor, the first transistor has a larger amount of fluctuation in the threshold voltage Vt due to back gate voltage than the second transistor. In other words, these transistors largely differ in their respective threshold voltages Vt when the back gate voltage is applied to them.

According to the embodiment of the present invention, the gap cx (in the gate width direction) between the trench and the device isolation insulating film in the first transistor is narrower than the gap ax between the adjoining trenches in the second transistor. This results in a smaller difference in the amount of fluctuation in Vt due to back gate voltage in these transistors. This reduces the difference in the threshold voltage Vt between these transistors which is due to back gate voltage. This is desirable for circuit actions.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
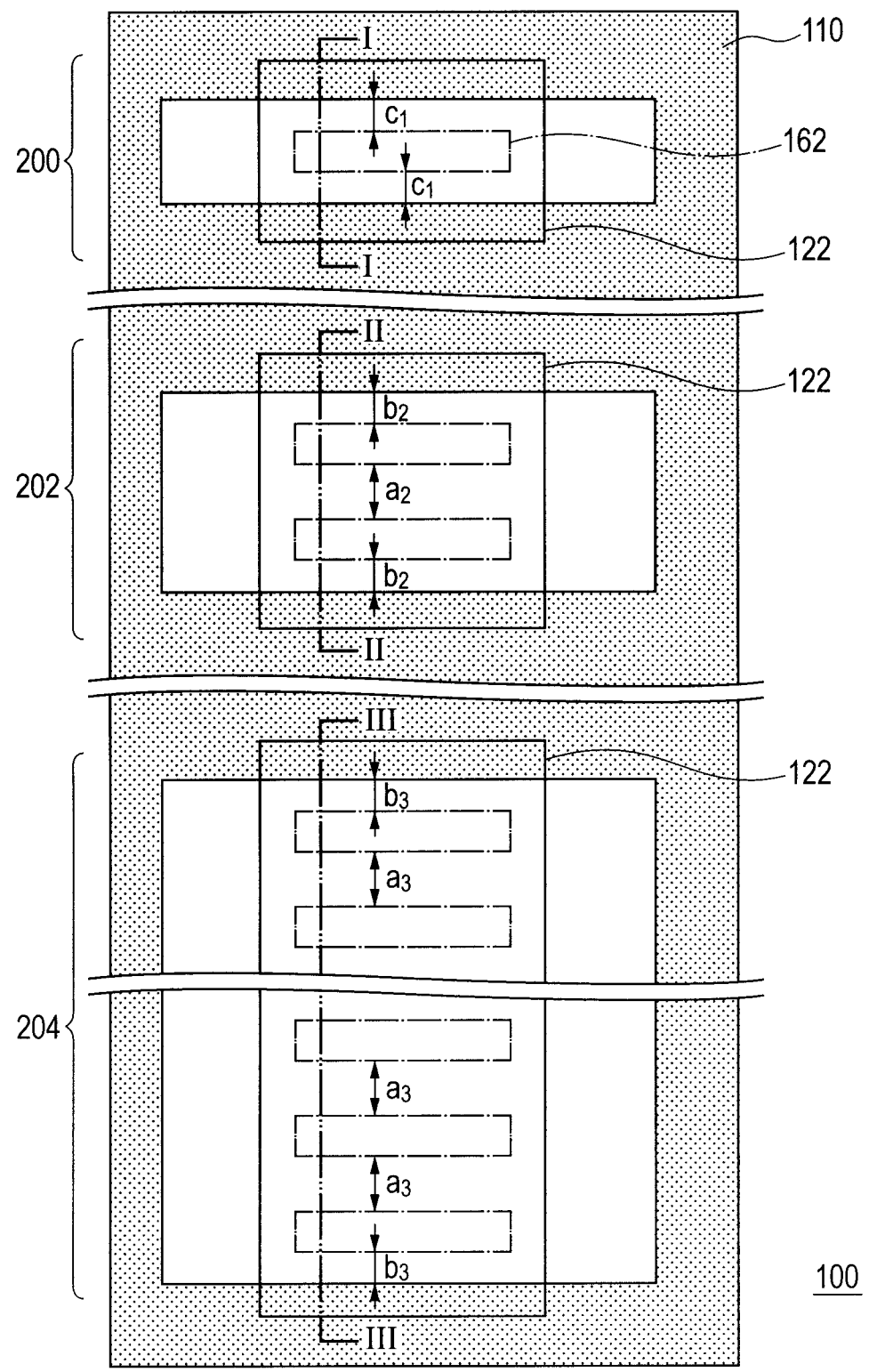
FIG. 1 is a schematic plan view showing one example of the structure of the semiconductor device pertaining to the embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the drawings, like components bearlike reference numerals and descriptions of such components are not necessarily repeated.

FIG. 1 is a schematic plan view showing one example of the structure of the semiconductor device 100 pertaining to the embodiment of the present invention. According to the embodiment of the present invention, the semiconductor device 100 contains a substrate (not shown) and a device isolation insulating film 110 which is formed on the substrate. In addition, the semiconductor device 100 contains a plurality of transistors, each having the source region and drain region of first conductivity type, both formed on one surface of the substrate, the channel region of second conductivity type which is formed on one surface of the substrate between the source region and the drain region in the gate length direction, as many trenches as n which are formed in the channel region on one surface of the substrate in such a way that they intermittently vary in depth in the gate width direction, the gate electrode which is so formed as to fill the inside of the n trenches in the channel region on one surface of the substrate, and the gate insulating film formed between the substrate and the gate electrode. According to the embodiment of the present invention, the semiconductor device 100 contains the first transistor 200 in which n=1, the second transistor 202 in which n=2, and the third transistor 204 in which n=13 or 15. The device isolation insulating film 110 in each transistor is formed on the lateral side of the source region and drain region in the gate length direction; it is also formed on both lateral sides of each of n trenches in the gate width direction. It is formed around the region in which the transistor is formed so that it separates the region in which the transistor is formed. As detailed later, this embodiment may be modified such that the first transistor 200 (in which n=1) differs from the second transistor 202 or the third transistor 204 (in which n=2 or larger) such that the gap (cx) between the trench in the gate width direction and the device isolation insulating film in the first transistor is smaller than the gap (ax) between the trenches in the gate width direction in the second or third transistor. The distance (gap cx) between the trench in the gate width direction and the device isolation insulating film and the distance (gap ax) between the trenches in the gate width direction in the second or third transistor may be measured at the same depth from surface of the substrate such as half height in horizontal plane, for example.

According to this embodiment, each of the first transistor 200, the second transistor 202, and the third transistor 204 is that of trench gate structure which contains the gate electrode formed in the trench 162 which is so formed as to intermittently vary in depth in the gate width direction. Each transistor may be that of vertical structure.

Figure 2A:
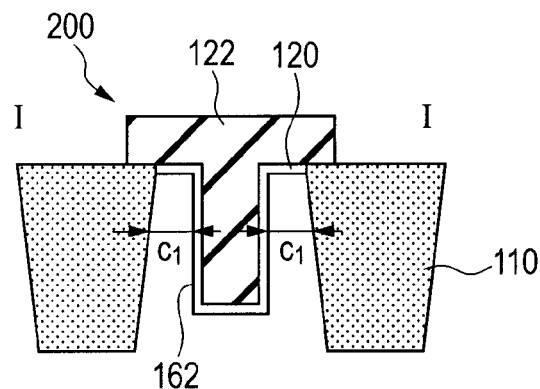
FIGS. 2A, 2B, and 2C are schematic sectional views showing the structure in cross-section of the semiconductor device shown in FIG. 1.
Figure 2B:
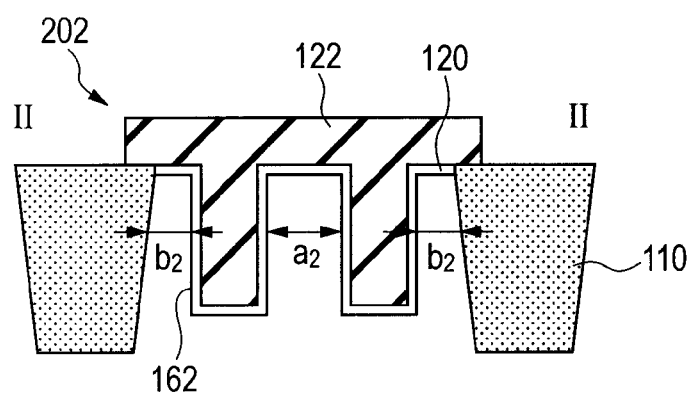
Figure 2C:
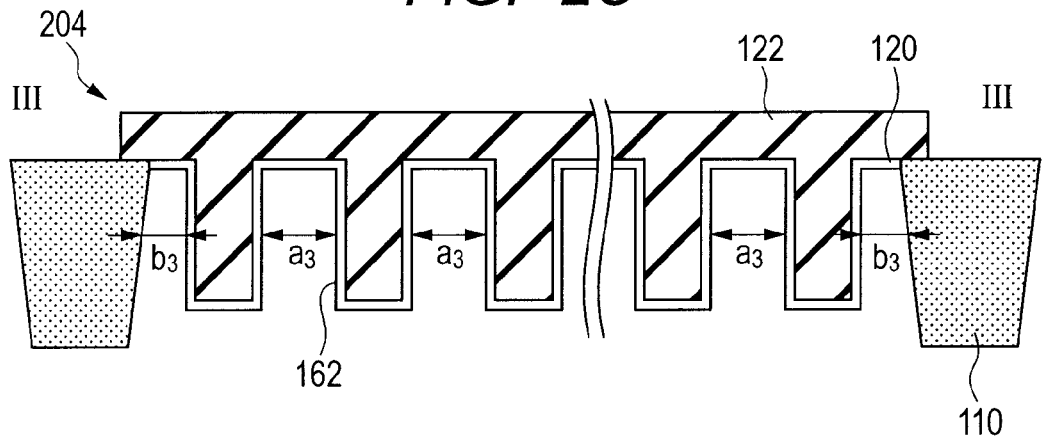

FIGS. 2A to 2C are schematic sectional views showing the structure in cross-section of the semiconductor device 100 shown in FIG. 1. FIG. 2A is a sectional view taken along the line I-I in FIG. 1. FIG. 2B is a sectional view taken along the line II-II in FIG. 1. FIG. 2C is a sectional view taken along the line III-III in FIG. 1.

Each transistor has the source region and drain region of first conductivity type which are formed on one surface of the substrate, the channel region of second conductivity type which is formed on one surface of the substrate between the source region and the drain region in the gate length direction, the trench 162 which is so formed as to intermittently vary in depth in the gate width direction in the channel region on one surface of the substrate, the gate electrode 122 which is so formed as to fill the inside of the trench in the channel region on one surface of the substrate, and the gate insulating film 120 which is formed between the substrate and the gate electrode.

The device isolation insulating film 110 is formed at the lateral side of the source region and the drain region in the gate length direction of each transistor. It is also formed at the lateral side of one trench 162 or each of the trenches 162 in the gate width direction. It is formed around the region in which the transistor is formed so that the region in which the transistor is formed is separated from other regions. It may be that of STI (Shallow Trench Isolation).

The following is a detailed description of the structure of the second transistor 202.

Figure 3:
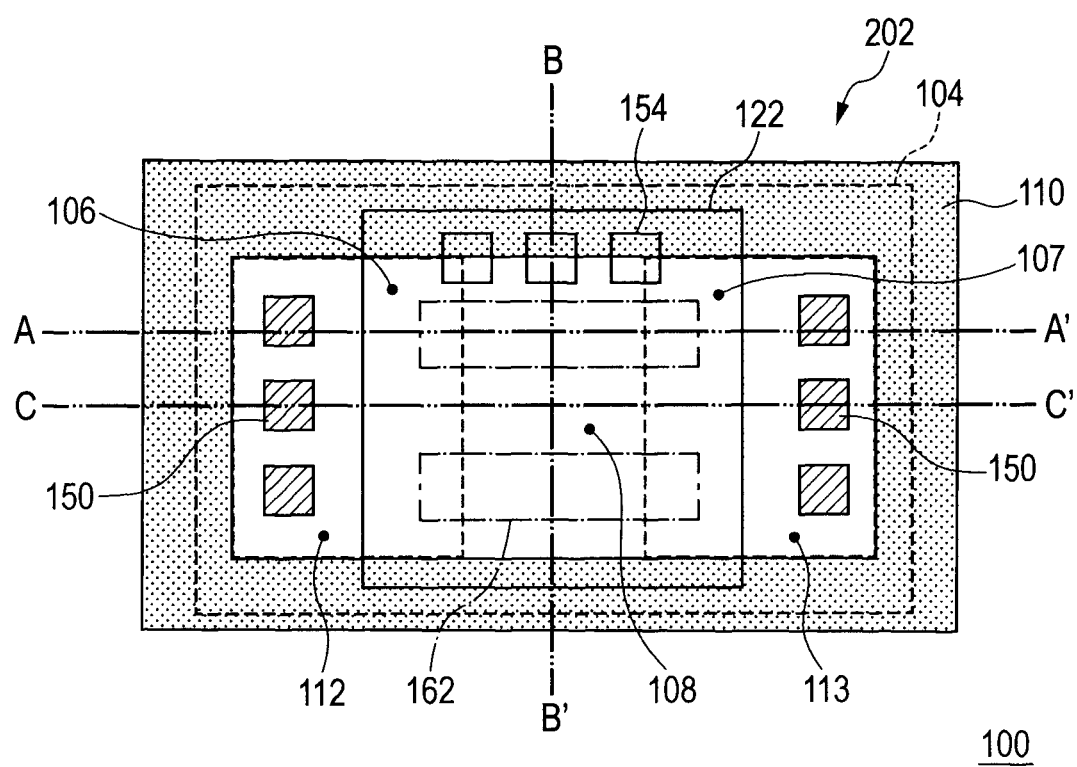
FIG. 3 is a diagram showing one example of the structure of the second transistor in the semiconductor device pertaining to the embodiment of the present invention.
Figure 4A:
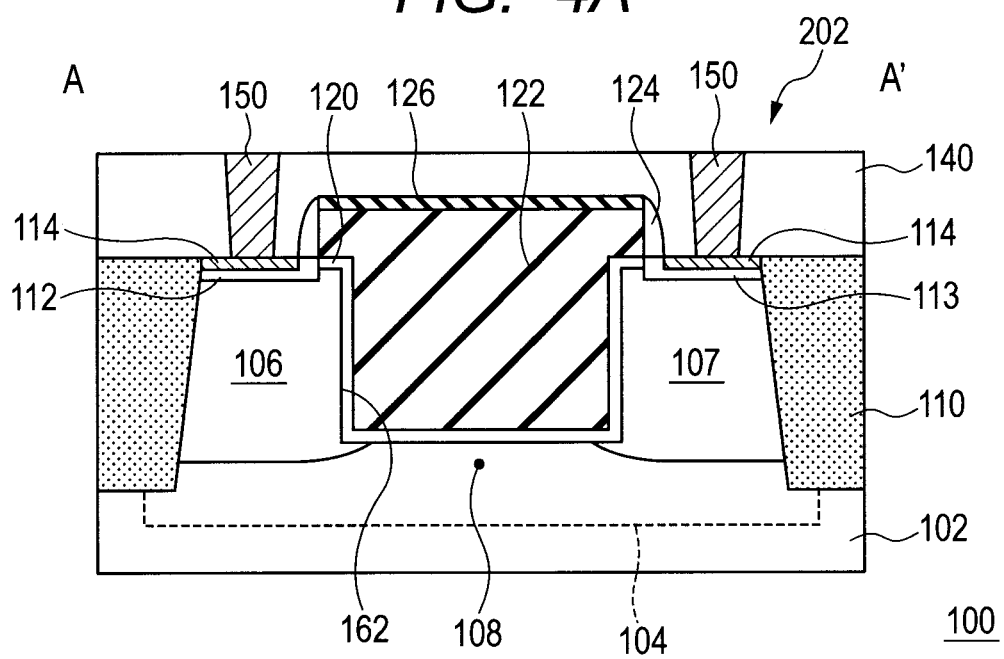
FIGS. 4A and 4B are diagrams showing one example of the structure of the second transistor in the semiconductor device pertaining to the embodiment of the present invention.
Figure 4B:
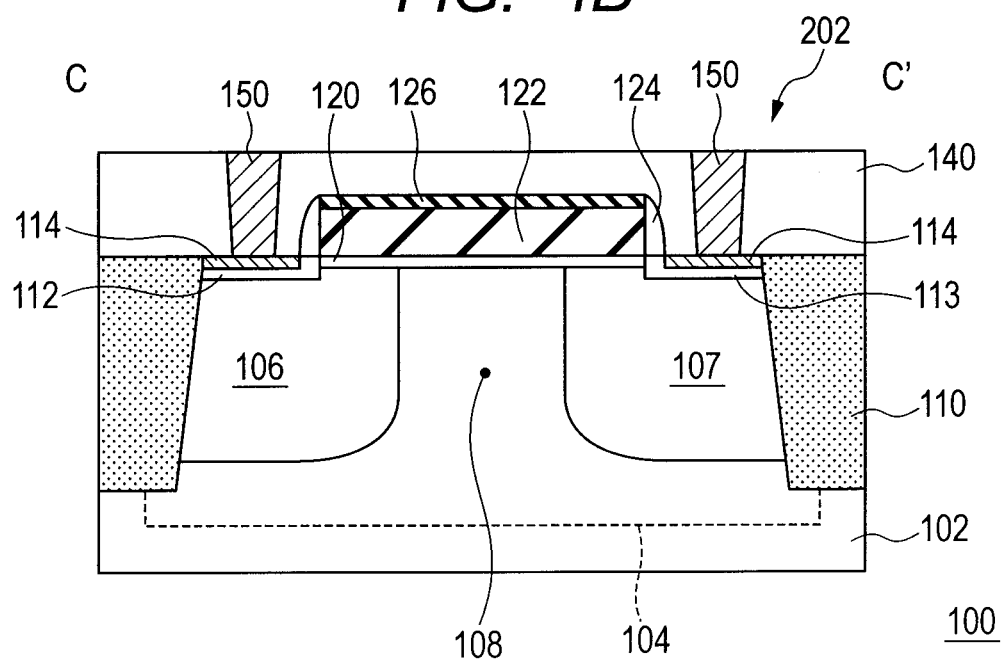
Figure 5:
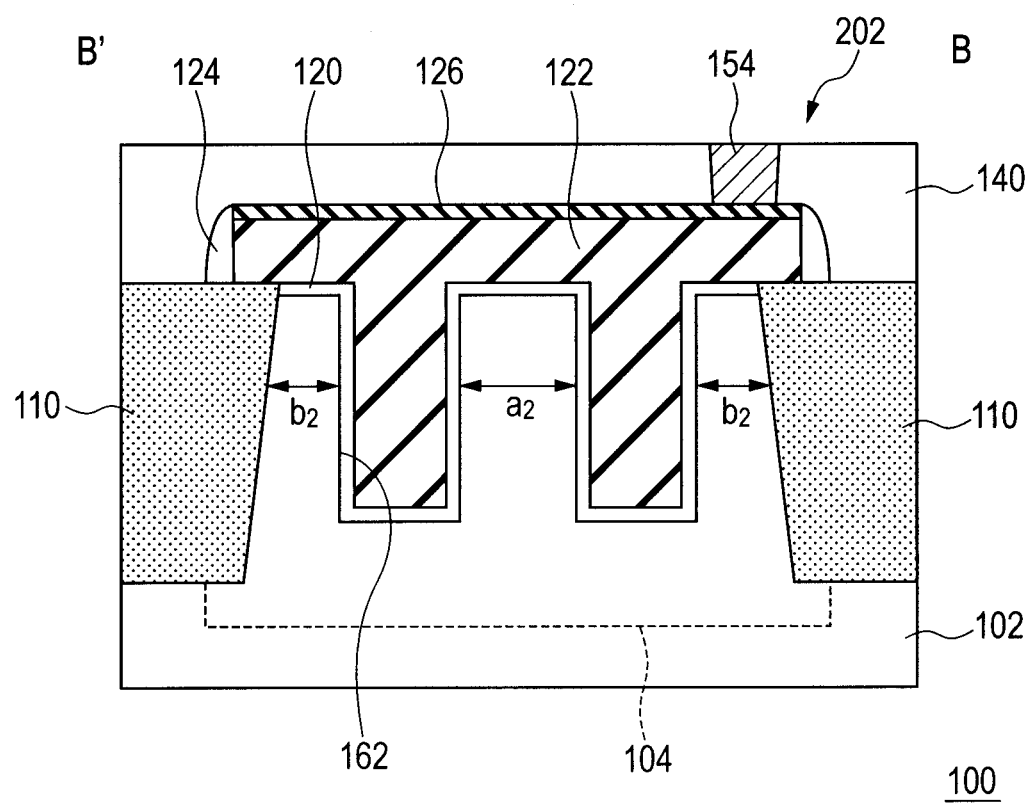
FIG. 5 is a diagram showing one example of the structure of the second transistor in the semiconductor device pertaining to the embodiment of the present invention.

Each of FIGS. 3 to 5 is a diagram showing one example of the structure of the second transistor 202 in the semiconductor device 100 pertaining to the embodiment of the present invention. FIG. 3 is a plan view. FIG. 4A is a sectional view taken along the line A-A' in FIG. 3. FIG. 4B is a sectional view taken along the line C-C' in FIG. 3. FIG. 5 is a sectional view taken along the line B-B' in FIG. 3. FIG. 3 shows each region with lines only so that the structure can be understood easily. In the following, it is assumed that the first conductivity type is n-type and the second conductivity type is p-type and each transistor is NMOS. However, the same structure may be applied even though the conduction type is reversed and each transistor is PMOS.

The semiconductor device 100 contains the substrate 102, which may be a semiconductor substrate such as silicon substrate. On one surface of the substrate 102 are formed the well 104, which is a diffusion region of p-type dopant (of second conductivity type), the source region 112 and the drain region 113, which are a diffusion region of n-type dopant (of first conductivity type), and the offset region 106 and the offset region 107, which are a diffusion region of n-type dopant (of first conductivity type) which are formed respectively around the source region 112 and the drain region 113.

The offset region 106, the offset region 107, the source region 112, and the drain region 113 are formed in the well 104. The channel region 108 of p-type (of second conductivity type) is that region in the well 104 which is formed between the source region 112 and the drain region 113 in the gate length direction and is defined by the offset region 106 and the offset region 107.

The second transistor 202 is formed on one surface of the substrate 102. In the channel region 108 on one surface of the substrate 102 are formed two trenches 162 in such a way that they intermittently vary in depth in the gate width direction. The second transistor 202 of the semiconductor device 100 contains the gate electrode 122 which is so formed as to fill the inside of the trench 162, the gate insulating film 120 formed between the gate electrode 122 and the substrate 102, and the side wall 124 formed close to the side wall of the gate electrode 122.

According to this embodiment, the source region 112 and the drain region 113 have the silicide layer 114 formed on the surface thereof, and the substrate 102 has the interlayer insulating film 140 formed thereon. The interlayer insulating film 140 has the contact 150 and the contact 154 formed therein which are connected respectively to the silicide layer 114 on the source region 112 and the drain region 113 and to the silicide layer 126 on the gate electrode 122.

The second transistor 202 is comprised mainly of the source region 112, the drain region 113, the offset region 106, the offset region 107, the gate insulating film 120, the gate electrode 122, the channel region 108, and the two trenches 162.

The first transistor 200 and the third transistor 204 may also be constructed in the same way as the second transistor except that they differ in the number of the trenches 162.

Incidentally, the device isolation insulting film 110 and the trench 162 may be identical or different in depth. According to this embodiment, they may be formed such that the lower end of the former is deeper than the lower end of the latter. In other words, the former may be deeper than the latter.

According to this embodiment, each transistor has the trench gate structure and has the gate electrode formed in the trench 162. This structure causes the semiconductor layer (the well 104) in the region between the trenches 162 to become fully depleted when a gate voltage is applied. This in turn reduces the fluctuation in Vt that occurs when a back gate voltage is applied.

The expression "when a back gate voltage is applied" implies not only the instance in which a prescribed back gate voltage is applied to the substrate 102 but also the instance in which a certain state arises that is similar to the state which arises when a back gate voltage is applied to the substrate 102. To be specific, it includes the state that arises when a reverse bias voltage is applied across the source and the substrate. The expression "a reverse bias voltage is applied" implies the state that arises in an NMOS when a prescribed voltage is applied to the source electrode so that the source potential becomes higher relative to the gate potential and a reverse bias voltage is applied across the source and the substrate.

The phenomenon that the semiconductor layer (the well 104) becomes depleted when a gate voltage is applied occurs also in the region between the trench 162 and the device isolation insulating film 110 even though the trench 162 exists at one side only. The device isolation insulating film 110, which is deeper than the trench 162, prevents the depletion layer from expanding in the direction perpendicular to the depthwise direction of the trench 162. This facilitates to make fully depleted the region between the trench 162 and the device isolation insulating film 110 over the entire region coving the depth of the trench. This holds true particularly for the first transistor 200 which has only one trench 162 and hence does not have the region held between trenches. With the device isolation insulating film 110 deeper than the trench 162, the region between the trench 162 and the device isolation insulating film 110 readily becomes fully depleted. This makes the trench structure transistor to exhibit its characteristic properties effectively.

In the embodiment shown in FIGS. 1 and 2, the first transistor 200 may have one trench 162 and the device isolation insulating film 110 such that each gap c1 (in the gate width direction) between them is equal at both sides of the trench.

Also, the second transistor 202 may have the trenches 162 and the device isolation insulating film 110 such that the gap b2 (in the gate width direction) between them is equal at both sides of the trench. The second transistor 202 has two trenches 162 which are apart from each other by the gap a2.

Also, the third transistor 204 may have the trenches 162 which are placed at equal intervals (or the gap a3) in the gate width direction. The third transistor 204 may have the trenches 162 and the device isolation insulating film 110 such that the gap b3 (in the gate width direction) between them is equal at both sides of the trench.

Another modification may be possible in such a way that the gap a2 between the trenches 162 in the second transistor 202 is equal to the gap a3 between the trenches 162 in the third transistor 204. Similar modification may also be possible in such a way that the gap b2 between the trench 162 and the device isolation insulating film 110 in the second transistor 202 is equal to the gap b3 between the trench 162 and the device isolation insulating film 110 in the third transistor 204. Further another modification may be possible in such a way that all the trenches 162 have an identical width (in the gate width direction) in the first transistor 200, the second transistor 202, and the third transistor 204.

The semiconductor device according to this embodiment is constructed such that the gap c1 (in the gate width direction) between the one trench 162 and the device isolation insulating film 110 in the first transistor 200 is narrower than the gap a2 (in the gate width direction) between the trenches 162 in the second transistor 202 and is also narrower than the gap a3 (in the gate width direction) between the trenches 162 in the third transistor 204.

As mentioned above, the present inventor found that the trench structure transistor fluctuates in the threshold voltage (Vt) due to back gate voltage by major factors which differ between the transistor having one trench and the transistor having two or more trenches.

To be more specific, the present inventor found that in the case of the first transistor 200 which has only one trench 162, the fluctuation in Vt that occurs when a back gate voltage is applied varies in amount depending on the dimensions of the gap c1 between the one trench 162 and the device isolation insulating film 110, and the larger the gap c1, the larger the amount of fluctuation in Vt.

On the other hand, the present inventor also found that, in the case of the second transistor 202 or the third transistor 204 which has two or more trenches 162, the amount of fluctuation in Vt due to back gate voltage depends on the gap b2 between the trench 162 and the device isolation insulating film 110 or the gap a2 or a3 between the adjoining trenches 162.

FIGS. 6 to 9 are diagrams each showing the relation between the dimensions (on abscissa) of any of the first transistor 200, the second transistor 202, and the third transistor 204 and the amount of fluctuation in Vt (on ordinate) due to back gate voltage in each transistor. "The amount of fluctuation in Vt due to back gate voltage" is expressed by $\Delta Vt=|Vt_1-Vt_0|$ where $Vt_0$ represents the threshold voltage of each transistor with its substrate 102 grounded and $Vt_1$ represents the threshold voltage of each transistor with a prescribed voltage applied to its substrate.

Figure 6:
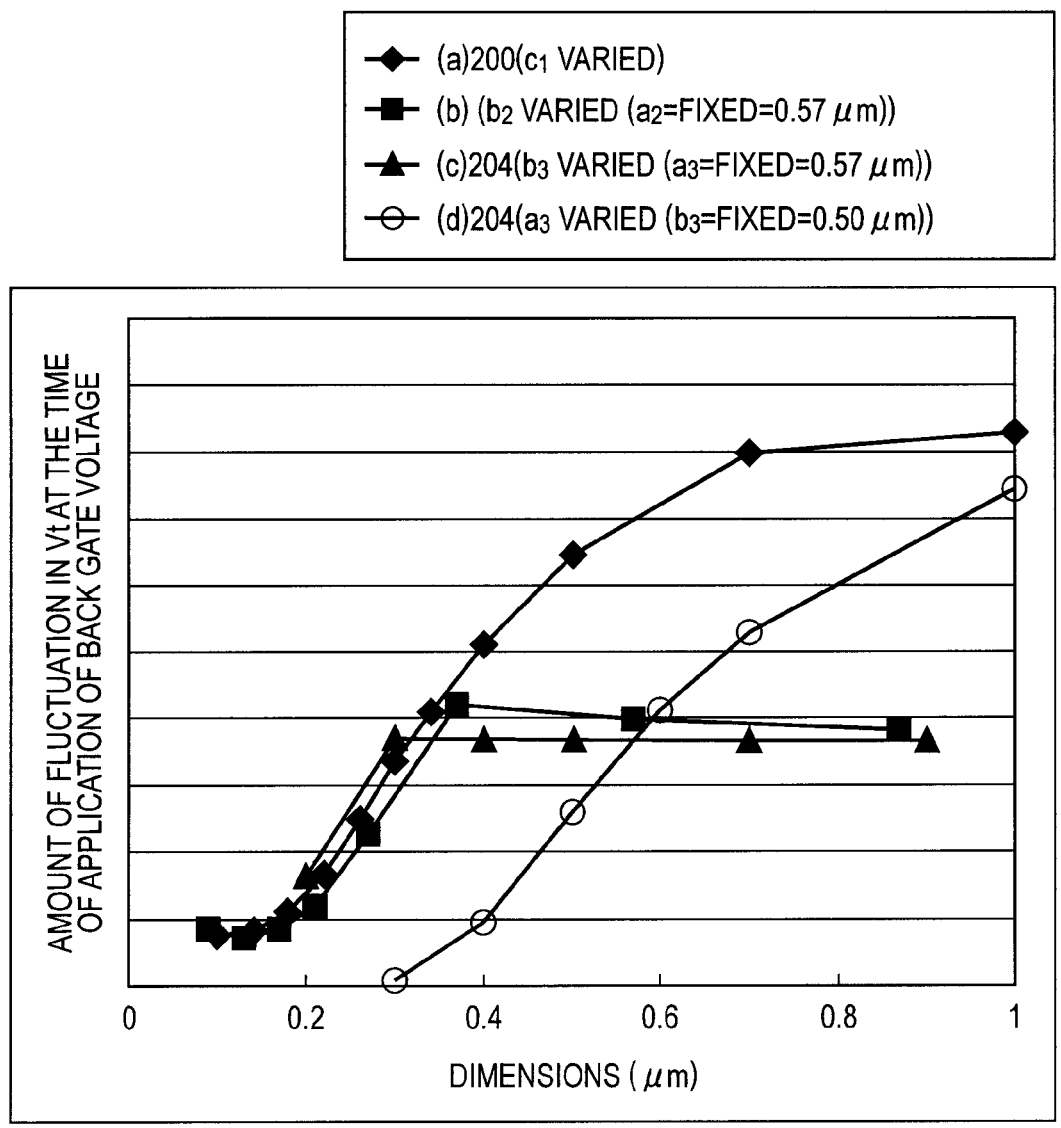
FIG. 6 is a diagram showing the relation between the dimensions of each transistor and the amount of fluctuation in Vt of each transistor which is observed when a back gate voltage is applied.
Figure 7:
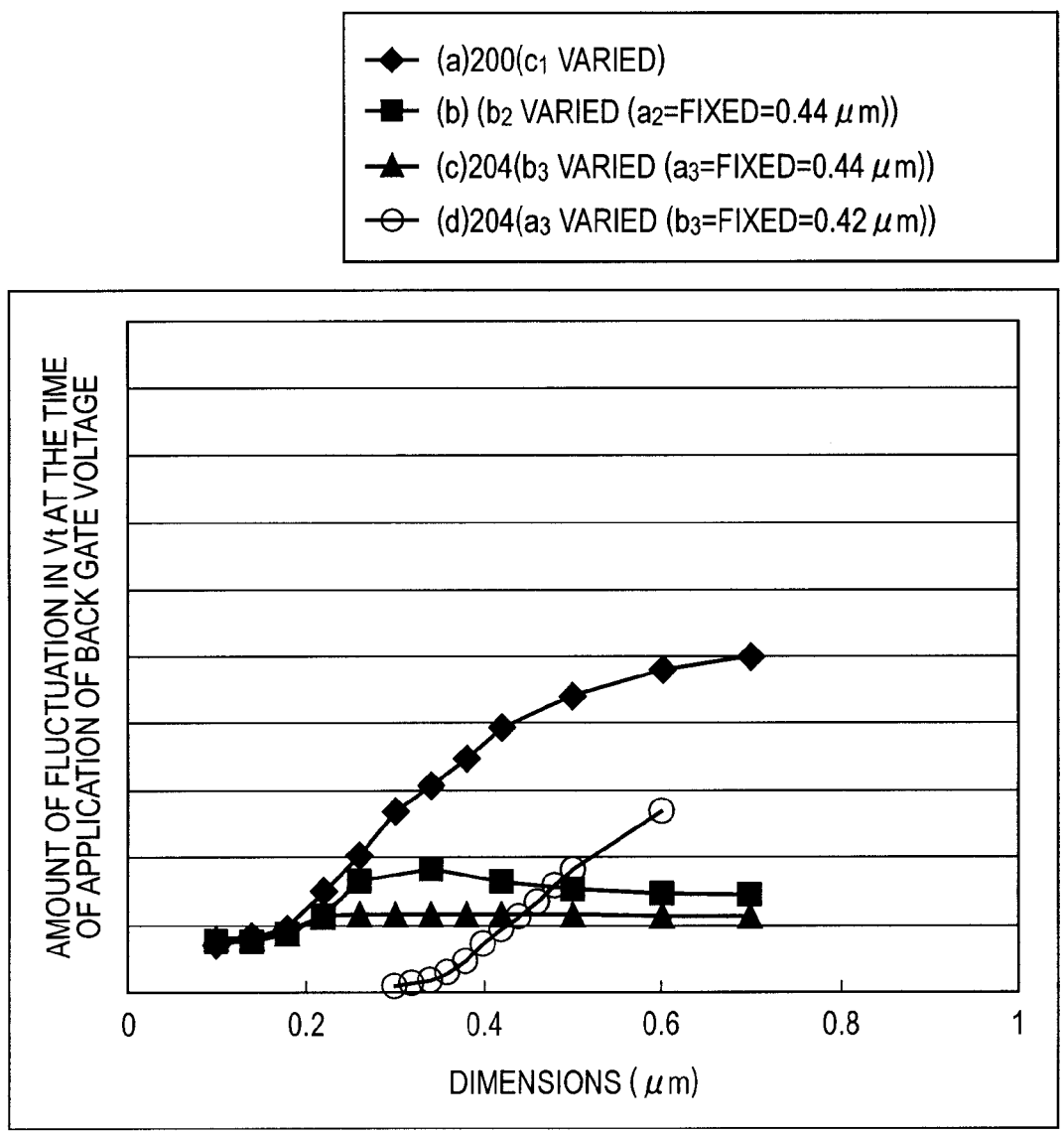
FIG. 7 is a diagram showing the relation between the dimensions of each transistor and the amount of fluctuation in Vt of each transistor which is observed when a back gate voltage is applied.

FIGS. 6 and 7 show the data in the case where all of the first, second, and third transistors 200, 202, and 204 are of NMOS type as explained above with reference to FIGS. 1 to 5.

Figure 8:
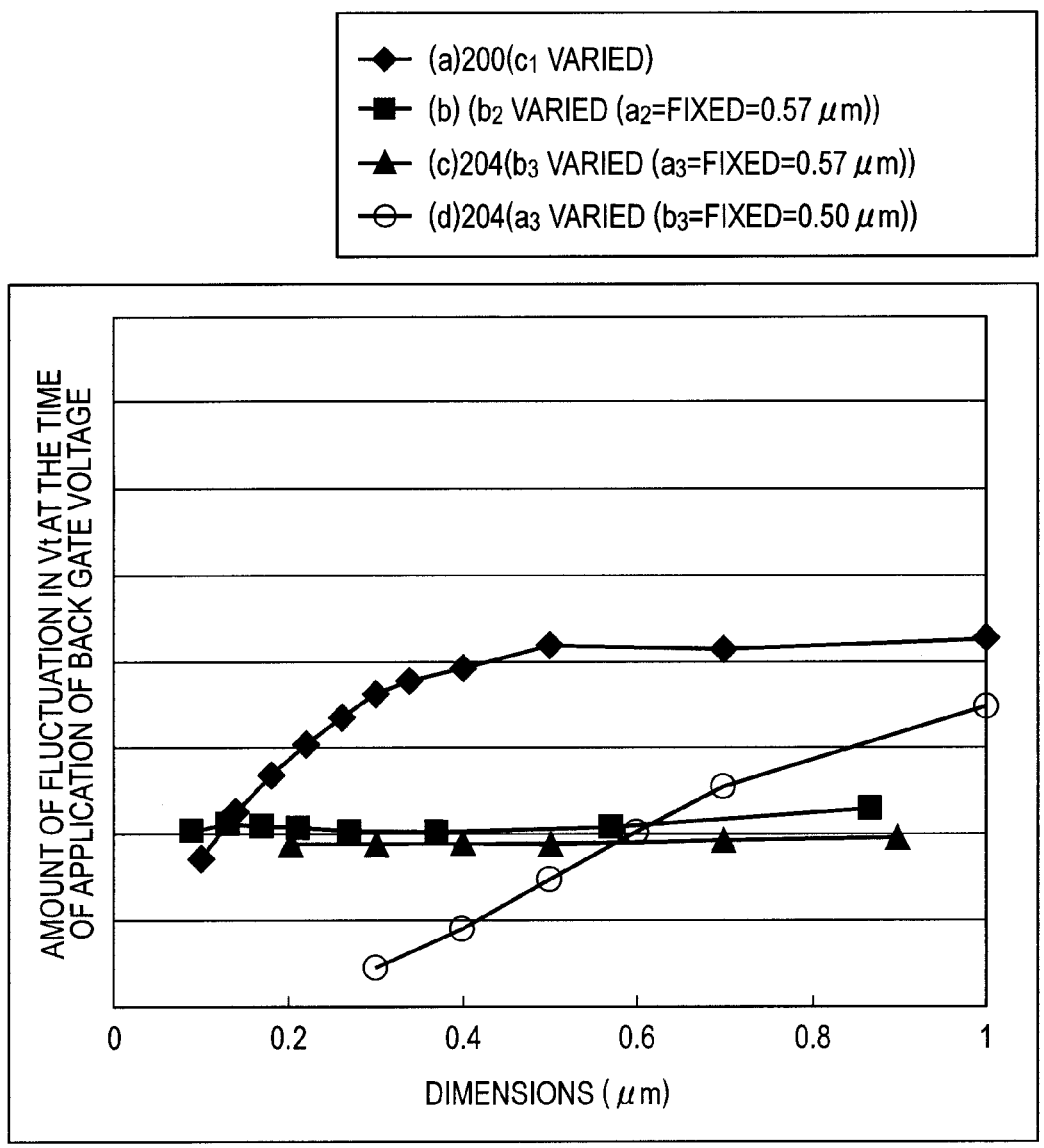
FIG. 8 is a diagram showing the relation between the dimensions of each transistor and the amount of fluctuation in Vt of each transistor which is observed when a back gate voltage is applied.
Figure 9:
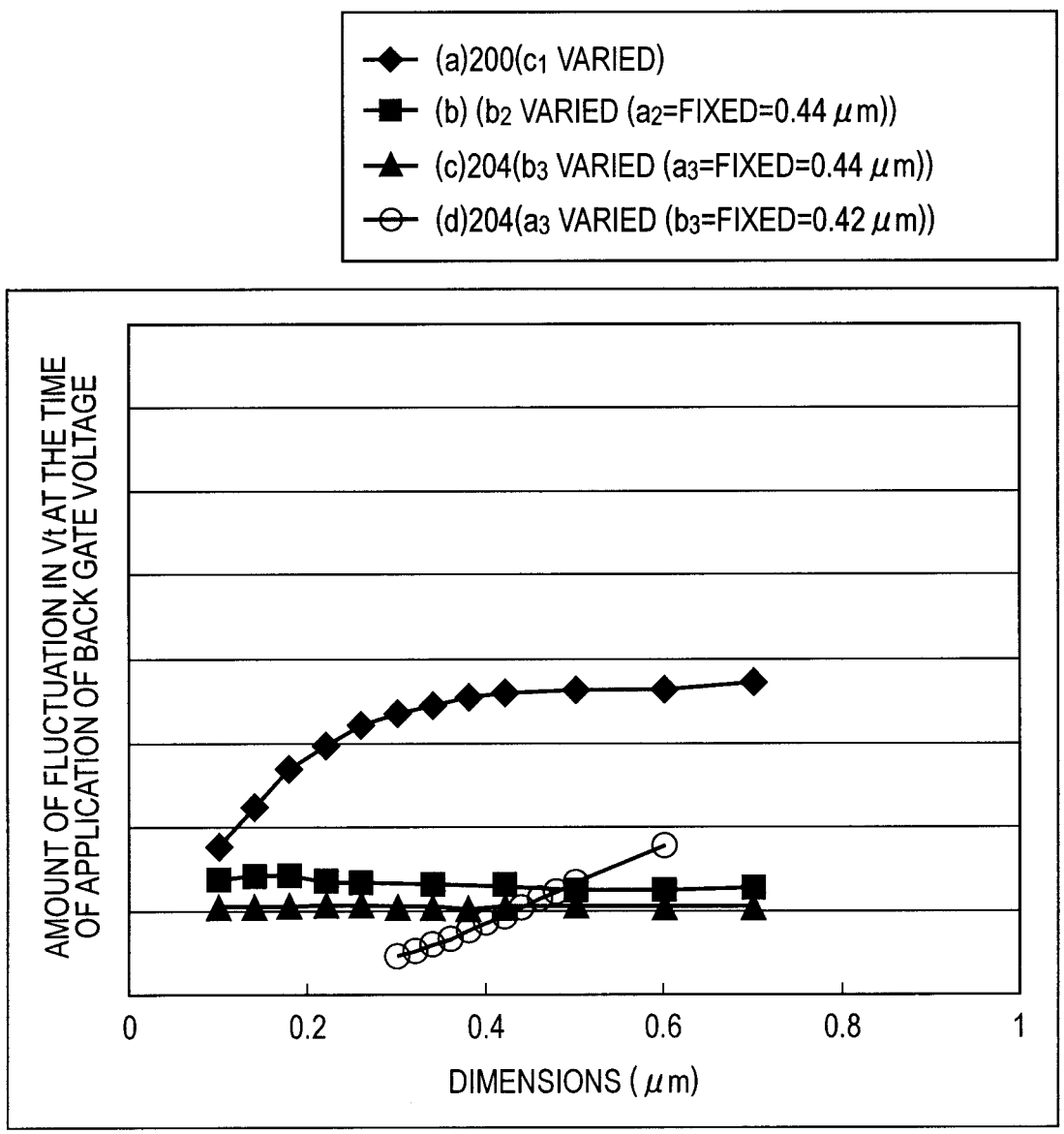
FIG. 9 is a diagram showing the relation between the dimensions of each transistor and the amount of fluctuation in Vt of each transistor which is observed when a back gate voltage is applied.

FIGS. 8 and 9 show the data in the case where all of the first, second, and third transistors 200, 202, and 204 are of PMOS type, which have the reverse conduction type.

In both cases, the trench 162 has a width of 0.24 μm in the gate width direction.

The sample for data shown in FIGS. 6 and 7 and the sample for data shown in FIGS. 8 and 9 differ from each other in the gap between the adjoining trenches 162 and the gap between the trench 162 and the device isolation insulating film 110.

The data shown in FIGS. 6 and 7 will be described below first.

The curve (a) represents the amount of fluctuation in Vt due to back gate voltage, with the gap c1 varied between the trench 162 and the device isolation insulating film 110 in the first transistor 200 which has only one trench 162.

The curve (b) represents the amount of fluctuation in Vt due to back gate voltage, with the gap b2 varied between the trench 162 and the device isolation insulating film 110 and the gap a2 kept constant between the adjoining trenches 162 in the second transistor 202 which has two trenches 162. The gap (a2) between the adjoining trenches 162 is 0.57 μm.

The curve (c) represents the amount of fluctuation in Vt due to back gate voltage, with the gap b3 varied between the trench 162 and the device isolation insulating film 110 and the gap a3 kept constant between the adjoining trenches 162 in the third transistor 204 which has thirteen trenches 162. The gap (a3) between the adjoining trenches 162 is 0.57 μm.

The curve (d) represents the amount of fluctuation in Vt due to back gate voltage, with the gap b3 kept constant between the trench 162 and the device isolation insulating film 110 and the gap a3 varied between the adjoining trenches 162 in the third transistor 204 which has thirteen trenches 162, like the one for the curve(c). The gap (b3) between the trench 162 and device isolation insulating film 110 is 0.50 μm.

The data shown in FIGS. 8 and 9 will be described below next. The curve (a) represents the amount of fluctuation in Vt due to back gate voltage, with the gap c1 varied between the trench 162 and the device isolation insulating film 110 in the first transistor 200 which has only one trench 162.

The curve (b) represents the amount of fluctuation in Vt due to back gate voltage, with the gap b2 varied between the trench 162 and the device isolation insulating film 110 and the gap a2 kept constant between the adjoining trenches 162 in the second transistor 202 which has two trenches 162. The gap (a2) between the adjoining trenches 162 is 0.44 μm.

The curve (c) represents the amount of fluctuation in Vt due to back gate voltage, with the gap b3 varied between the trench 162 and the device isolation insulating film 110 and the gap a3 kept constant between the adjoining trenches 162 in the third transistor 204 which has fifteen trenches 162. The gap (a3) between the adjoining trenches 162 is 0.44 μm.

The curve (d) represents the amount of fluctuation in Vt due to back gate voltage, with the gap a3 varied between the adjoining trenches 162 and the gap b3 kept constant between the trench 162 and the device isolation insulating film 110 in the third transistor 204 which has fifteen trenches 162. The gap (b3) between the trench 162 and device isolation insulating film 110 is 0.42 μm.

The result will be described below.

In the case where the transistors for FIGS. 6 and 7 are of NMOS type, the first transistor 200 which has only one trench 162 fluctuates in Vt due to back gate electrode in such a way that the amount of fluctuation in Vt depends on the dimensions of the gap c1, and the larger the gap c1, the larger the amount of fluctuation in Vt. This is apparent from the curve (a).

On the other hand, the third transistor 204 which has thirteen or fifteen trenches 162 fluctuates in Vt in such a way that the amount of fluctuation in Vt depends on the dimensions of the gap a3, and the larger the gap a3, the larger the amount of fluctuation in Vt. This is apparent from the curve (d). Also, the second transistor 202 which has two trenches 162 fluctuates in Vt in such away that the amount of fluctuation in Vt depends on the dimensions of the gap a2, and the larger the gap a2, the larger the amount of fluctuation in Vt, as in the case of the third transistor 204. This is not shown in FIGS. 6 and 7.

Also, the second transistor 202 and the third transistor 204 fluctuate in Vt depending on the dimensions of the gap b2 and the gap b3 almost in the same way. This is apparent from the curves (b) and (c). In other words, the second transistor 202 and the third transistor 204, both of which have two or more trenches 162, fluctuate in Vt due to back gate voltage depending on the same major factors.

In the case where the gap b2 and the gap b3 are narrower than the gap a2 and the gap a3, the amount of fluctuation in Vt depends on the dimensions of the gap b2 and the gap b3. In this case, too, the second transistor 202 and the third transistor 204 fluctuate in Vt in the same amount depending on the gap b2 and the gap b3. Also, so long as the gap b2 and the gap b3 are narrow and the amount of fluctuation in Vt depends on the dimensions of the gap b2 and the gap b3, the first transistor 200 fluctuates in Vt due to back gate voltage depending on the same major factors that affect the second transistor 202 and the third transistor 204. In other words, in this case, the first transistor 200, the second transistor 202, and the third transistor 204 fluctuate in Vt in the same amount which depends on the dimensions of the gap c1, the gap b2, and the gap b3. Therefore, if the gap c1 of the first transistor 200 is made equal to the gap b2 and the gap b3, the difference in the amount of fluctuation in Vt due to back gate voltage can be made almost equal for these transistors.

That is to say, in this case, too, if these transistors are constructed such that the gap c1 between the trench 162 and the device isolation insulating film 110 in the first transistor 200 is narrower than the gap a2 between the adjoining trenches 162 in the second transistor 202 and the gap a3 between the adjoining trenches 162 in the third transistor 204, then the difference in the amount of fluctuation in Vt due to back gate voltage can be reduced in these transistors.

In the case where the transistors for FIGS. 8 and 9 are of PMOS type, too, the third transistor 204 which has thirteen trenches 162 fluctuates in Vt due to back gate voltage in such a way that the amount of fluctuation in Vt depends on the dimensions of the gap a3, and the larger the gap a3, the larger the amount of fluctuation in Vt. This is apparent from the curve (d). Also, the second transistor 202 which has two trenches 162 fluctuates in Vt in such a way that the amount of fluctuation in Vt depends on the dimensions of the gap a2, and the larger the gap a2, the larger the amount of fluctuation in Vt, as in the case of the third transistor 204. This is not shown in FIGS. 8 and 9.

In the case where each transistor is of PMOS type, too, the second transistor 202 and the third transistor 204 fluctuate in Vt depending on the dimensions of the gap b2 and the gap b3 in almost the same way. This is apparent from the curves (b) and (c). In the case of the second transistor 202 and the third transistor 204, both of which have two or more trenches 162, the amount of fluctuation in Vt due to back gate voltage does not depend on the dimensions of the gap b2 and the gap b3 but remains constant regardless of the dimensions of the gap b2 and the gap b3.

Moreover, in the case of both NMOS and PMOS, if the gap c1 in the first transistor 200, which has only one trench, is equal to the gap a3 in the third transistor 204, which has two or more trenches, the amount of fluctuation in Vt due to back gate voltage in the first transistor 200 is larger than the amount of fluctuation in Vt due to back gate voltage in the third transistor 204. A probable reason for this is as follows. In the case of the third transistor 204, which has two or more trenches 162, the region between the adjoining trenches 162 receives the back gate voltage from both sides under the influence of the gate electrode 122 buried in the trenches 162 at both sides. By contrast, in the case of the first transistor 200, which has only one trench 162, receives the back gate voltage from one side only. This increases the amount of fluctuation in Vt unless the gap is small.

In the case where several kinds of transistors differing in the number of trenches 162 are formed on the substrate 102 and they are controlled simultaneously, the amount of fluctuation in Vt due to back gate voltage may greatly vary from one transistor to another. If the back gate voltage is applied in such a situation, the threshold voltage of Vt greatly varies from one transistor to another, and this is not desirable for operation in some kinds of circuits.

According to this embodiment, the semiconductor device is constructed such that the gap c1 between the trench 162 and the device isolation insulating film 110 in the first transistor 200 is narrower than the gap a2 between the adjoining trenches 162 in the second transistor 202 and the gap a3 between the adjoining trenches 162 in the third transistor 204. This structure reduces the difference in the amount of fluctuation in Vt due to back gate voltage in these transistors.

In addition, according to this embodiment, the gap c1 between the trench 162 and the device isolation insulating film 110 in the first transistor 200 may be determined according to the dimensions of the gap a2 and the gap a3 in the second transistor 202 and the third transistor 204, both of which have two or more trenches, in consideration of the amount of fluctuation in Vt due to back gate voltage.

Figure 10:
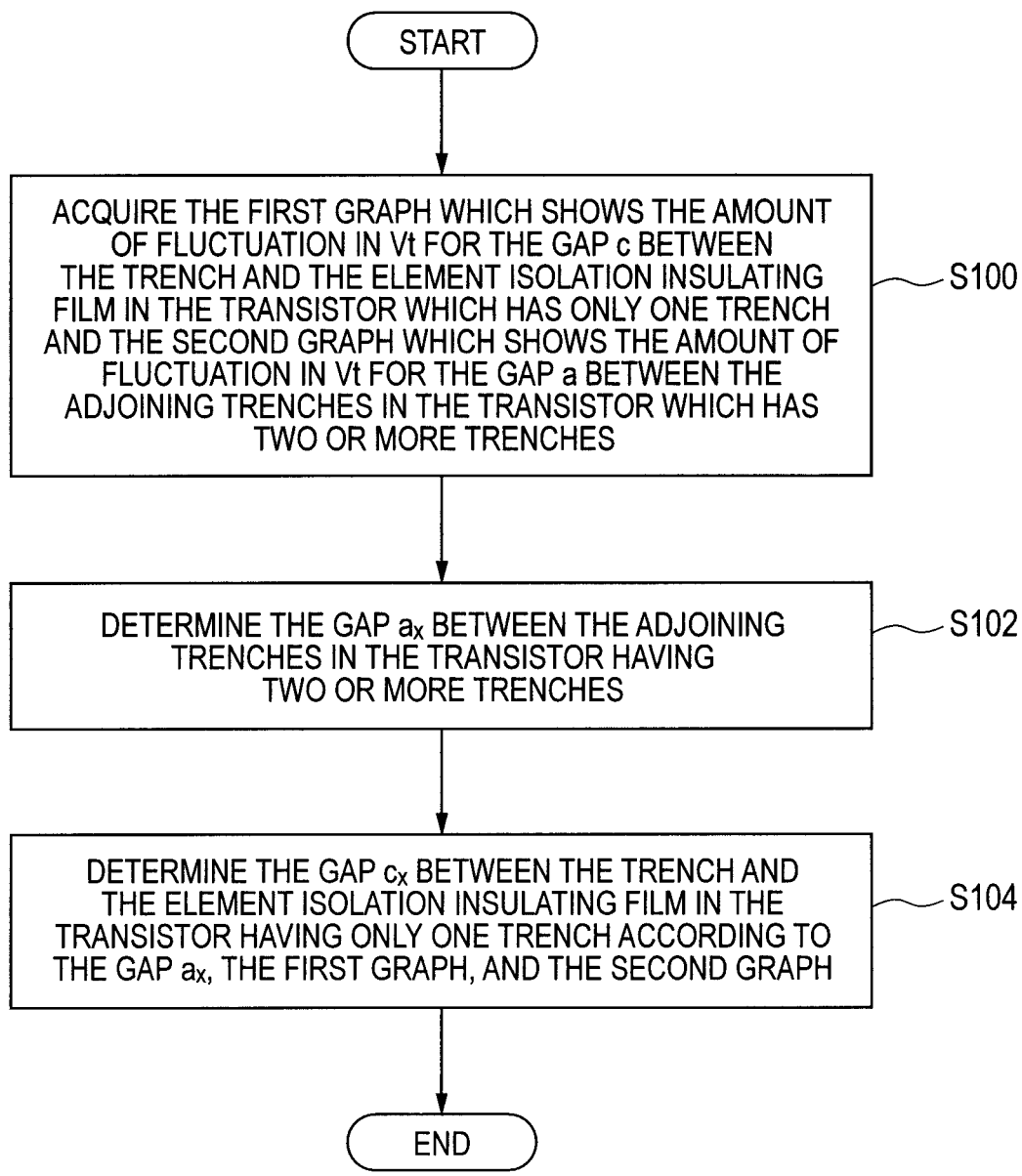
FIG. 10 is a flow chart showing the procedure of determining the gap (cx) between the trench and the device isolation insulating film for the first transistor.

FIG. 10 is a flow chart showing the procedure of determining the gap (cx) between the trench 162 and the device isolation insulating film 110 for the first transistor 200.

The first step is to acquire the first graph which shows the amount of fluctuation in Vt for the gap c between the trench and the device isolation insulating film in the transistor which has only one trench and the second graph which shows the amount of fluctuation in Vt for the gap a between the adjoining trenches in the transistor which has two or more trenches (with the gap b kept constant between the trench and the device isolation insulating film). (Step S100)

The next step is to determine the gap ax between the adjoining trenches in the transistor having two or more trenches. (Step S102) The subsequent step is to determine the gap cx between the trench and the device isolation insulating film in the transistor having only one trench according to the gap ax, the first graph, and the second graph. (Step S104)

Figure 11A:
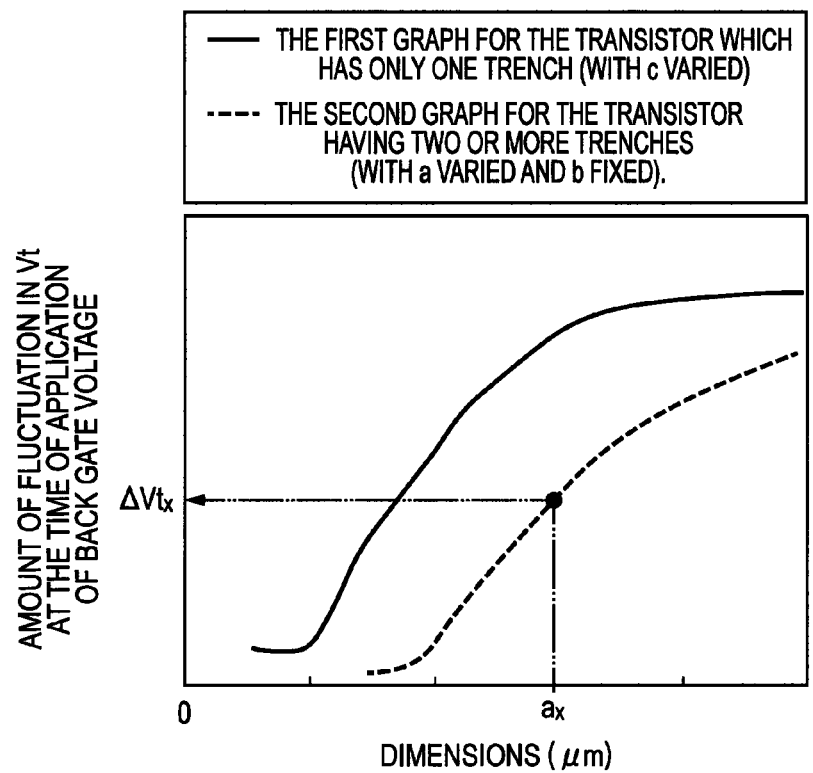
FIG. 11A is a first graphical representation for the transistor having one trench.
Figure 11B:
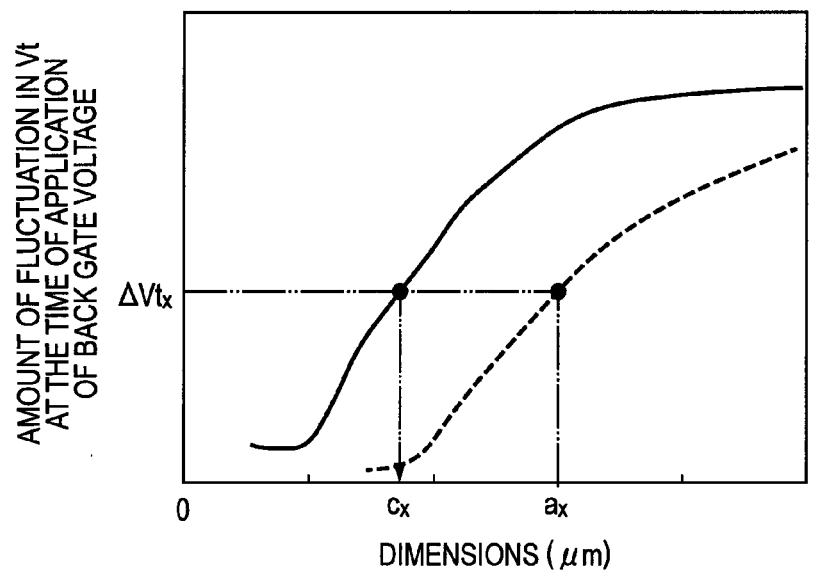
FIG. 11B is a second graphical representation for the transistor having two or more trenches.

FIGS. 11A and 11B are schematic diagram showing an example of the first graph and the second graph. The solid line in this diagram represents the first graph for the transistor which has only one trench, and the broken line in diagram represents the second graph for the transistor having two or more trenches.

One determines first the gap ax between the adjoining trenches in the transistor having two or more trenches and then finds the amount of fluctuation (ΔVtx) in Vt according to the second graph. (See FIG. 11A.) Next, one determines the gap cx between the trench and the device isolation insulating film in the transistor having only one trench such that the amount of fluctuation in Vt is ΔVtx, according to the first graph. (See FIG. 11B.)

The foregoing procedure permits the transistor having only one trench and the transistor having two or more trenches to be equal in the amount of fluctuation in Vt.

As explained above with reference to FIGS. 6 to 9, the transistors having two or more trenches 162 are approximately equal, regardless of the number of the trenches 162, in the amount of fluctuation in Vt that depends on the dimensions of the gap a2 and the gap b2 and the amount of fluctuation in Vt that depends on the dimensions of the gap a3 and the gap b3. Thus, the second graph for the transistors having two or more trenches 162, once it has been acquired, can be used when another transistor varying in the number of trenches 162 is to be formed.

The foregoing is an example of the procedure for determining the gap ax and then the gap cx on the basis of the gap ax and the first and second graphs. The order of this procedure may be reversed so that the gap cx is determined first and then the gap axis determined on the basis of the gap cx and the first and second graphs.

The embodiment mentioned above may be so modified as to equalize the gap c1 between the trench 162 and the device isolation insulating film 110 in the first transistor 200 and the gap b2 and the gap b3 between the trench 162 and the device isolation insulating film 110 in the second transistor 202 and the third transistor 204. This modification makes it possible to reduce the dimensions of the second transistor 202 and the third transistor 204. Moreover, it simplifies the layout design because the same design can be applied to the layout of the first transistor 200 and both of the second transistor 202 and the third transistor 204.

According to this embodiment, the semiconductor device 100 may be produced in the same ordinary process as employed for the trench structure transistor.

An example of the production process is briefly described below. The first step is to coat one surface of the substrate 102 with the device isolation insulating film 110 which demarcates the region in which each transistor is formed.

The next step is to form by lithography the offset region 106 and the offset region 107 by ion implantation of n-type dopant in each region demarcated by the device isolation insulating film 110 on one surface of the substrate 102. The next step is to form by lithography the well 104 by ion implantation of p-type dopant in each region demarcated by the device isolation insulating film 110 on one surface of the substrate 102.

The next step is to form the trench 162 in the prescribed region in each region demarcated by the device isolation insulating film 110 on one surface of the substrate 102. Incidentally, according to this embodiment, the device isolation insulating film 110 and the trench 162 may have the dimensions as mentioned above.

The next step is to form the gate insulating film 120 on the trench 162 and the surface of the substrate 102. The next step is to form the gate electrode 122 on the substrate 102 so as to fill the trench 162. The next step is to form the side wall 124 on the lateral side of the gate electrode 122. The next step is to form the source region 112 and the drain region 113 by ion implantation of n-type dopant, with the gate electrode 122 and the side wall 124 being used as the mask.

The next step is to form the silicide layer 114 and the silicide layer 126 respectively on the surface of the substrate 102 and the surface of the gate electrode 122. The next step is to form the interlayer insulating film 140 on the entire surface of the substrate 102, to form the contact hole in the interlayer insulating film 140, and to fill the contact hole with a conducting material, thereby forming the contact 150 and the contact 154. In this way, there is obtained the semiconductor device 100 which is constructed as mentioned above with reference to FIGS. 1 to 5.

The semiconductor device 100 according to this embodiment produces the following effects.

As mentioned above, the first transistor 200 having only one trench 162 differs from the second transistor 202 and the third transistor 204, both of which have two or more trenches 162, in the major factors that cause the threshold voltage Vt to fluctuate due to back gate voltage. In the case of the first transistor 200, the amount of fluctuation in Vt due to back gate voltage depends on the gap c (in the gate width direction) between the trench 162 and the element separation isolating film 110, whereas in the case of the second transistor 202 and the third transistor 204, the amount of fluctuation in Vt due to back gate voltage depends basically on the gap a (in the gate width direction) between the adjoining trenches 162. Also, if the gap c in the first transistor 200 is equal to the gap a in the second transistor 202 and the third transistor 204, the first transistor 200 has a larger amount of fluctuation in Vt due to back gate voltage than the second transistor 202 and the third transistor 204.

According to this embodiment, the gap cx (in the gate width direction) between the trench 162 and the device isolation insulating film 110 in the first transistor 200 is narrower than the gap ax between the adjoining trenches 162 in the second transistor 202 and the third transistor 204. This results in a smaller difference in the amount of fluctuation in Vt due to back gate voltage in these transistors. This in turn reduces the difference in Vt among these transistors which is due to back gate voltage. This is desirable for circuit actions.

Although the embodiments of the present invention have been described above with reference to the accompanying drawings, they are merely examples and they may be variously modified according to need.

The present invention may be embodied with any combination of the above-mentioned constituents and in terms of method, apparatus, system, recording medium, computer program, and the like.

The embodiment mentioned above demonstrates a semiconductor device having the first transistor 200 combined with the second transistor 202 and the third transistor 204. However, it may be modified such that the first transistor 200 is combined with either of the second transistor 202 and the third transistor 204. The transistor which has 2 or 13 trenches 162 may have as many trenches as necessary.

What is claimed is:

1. A semiconductor device comprising:
   a substrate;
   a device isolation region;
   a first and a second source region and a first and a second drain region, all of which are of a first conductivity type;

a first and a second channel region of a second conductivity type located respectively between the first source region and the first drain region and between the second source region and the second drain region;

a first transistor including a single trench which is formed on the substrate between the first source region and the first drain region and a first gate electrode which is formed in the single trench; and a second transistor including at least two trenches which are formed on the substrate between the second source region and the second drain region and a second gate electrode which is formed in the at least two trenches, wherein the first channel region is arranged in a first direction of a plan view of the substrate between the first source region and the first drain region, wherein the second channel region is arranged in a second direction of the plan view between the second source region and the second drain region, wherein a distance between the single trench and the device isolation region in a third direction crossing the first direction of the plan view is less than a distance between adjacent ones of said at least two trenches in a fourth direction crossing the second direction of the plan view, and wherein, in the first transistor, the device isolation region is arranged so as to surround the single trench such that the single trench is spaced apart from the device isolation region in the first and the third directions.

2. The semiconductor device according to claim 1, wherein in the first transistor and the second transistor, the device isolation region is formed in a depth direction of the substrate such that its lower end is deeper than the lower end of the single trench and the at least two trenches.

3. The semiconductor device according to claim 1, wherein a distance between a trench adjacent to the device isolation region and the device isolation region in the second transistor and a distance between the single trench and the device isolation region in the first transistor is equal.

4. The semiconductor device according to claim 1, wherein the single trench and the at least two trenches are formed such that respective widths of the single trench and the at least two trenches in the third and the fourth directions are equal.

5. The semiconductor device according to claim 1,
wherein in the second transistor, the device isolation region is arranged so as to surround the at least two trenches such that the at least two trenches are spaced apart from the device isolation region in the second and the fourth directions.

6. The semiconductor device according to claim 1,
wherein the device isolation region is comprised of an isolation trench and an insulating film formed in the isolation trench such that a depth of the isolation trench in a depth direction of the substrate is greater than a depth of the single trench and the at least two trenches in the depth direction of the substrate.

7. A method for manufacturing a semiconductor device, comprising:
forming each of i) a device isolation region on a substrate, ii) a first and a second source region and a first and a second drain region, all of which are of a first conductivity type, iii) a first and a second channel region of a second conductivity type located respectively between the first source region and the first drain region and between the second source region and the second drain region, iv) a first transistor including a single trench which is formed on the substrate between the first source region and the first drain region and a first gate electrode which is formed in the single trench, and v) a second transistor including at least two trenches which are formed on the substrate between the second source region and the second drain region and a second gate electrode which is formed in the at least two trenches, the first channel region arranged in a first direction of a plan view of the substrate between the first source region and the first drain region, and the second channel region arranged in a second direction of the plan view between the second source region and the second drain region, wherein the forming step includes the step of determining values of a distance ax and a distance cx such that the distance cx between the single trench and the device isolation region in a third direction crossing the first direction of the plan view is less than the distance ax between adjacent ones of said at least two trenches in a fourth direction crossing the second direction of the plan view, and wherein said determining step comprises the sub-steps of:
obtaining a first relationship between the value of the distance cx and a variation amount of a threshold voltage when changing a back gate voltage;
obtaining a second relationship between the value of the distance ax and a variation amount of the threshold voltage when changing a back gate voltage;
determining either value of the distance ax and the distance cx; and
determining the other value of the distance ax and the distance cx using the first and second relationships, such that there exists only a small difference in the variation amounts of threshold voltage between the first transistor and the second transistor.

8. A semiconductor device comprising:
a substrate;
a device isolation region;
a first and a second source region and a first and a second drain region, all of which are of a first conductivity type;
a first and a second channel region of a second conductivity type located respectively between the first source region and the first drain region and between the second source region and the second drain region;
a first transistor including a single trench which is formed on the substrate between the first source region and the first drain region and a first gate electrode which is formed in the single trench; and
a second transistor including at least two trenches which are formed on the substrate between the second source region and the second drain region and a second gate electrode which is formed in the at least two trenches, wherein the first channel region is arranged in a first direction of a plan view of the substrate between the first source region and the first drain region, wherein the second channel region is arranged in a second direction of the plan view between the second source region and the second drain region, wherein a distance between the single trench and the device isolation region in a third direction crossing the first direction of the plan view is less than a distance between adjacent ones of said at least two trenches in a fourth direction crossing the second direction of the plan view, and wherein, in the second transistor, the device isolation region is arranged so as to surround the at least two trenches such that the at least two trenches are spaced apart from the device isolation region in the second and the fourth directions.

* * * * *